(12) United States Patent
Austin et al.

(10) Patent No.: US 7,408,782 B2
(45) Date of Patent: Aug. 5, 2008

(54) MULTIPLE PRINTED CIRCUIT BOARD HEAT TRANSFER GUIDE PLATES

(75) Inventors: David M. Austin, Plano, TX (US); Daniel J. Calanni, Plano, TX (US); Lawrence M. Giacoma, Plano, TX (US); Jay H. Dorval, Lucas, TX (US)

(73) Assignee: Tellabs Bedford, Inc., Naperville, IL (US)

( * ) Notice: Subject to any disclaimer, the term of this patent is extended or adjusted under 35 U.S.C. 154(b) by 58 days.

(21) Appl. No.: 11/649,745

(22) Filed: Jan. 4, 2007

(65) Prior Publication Data

US 2008/0164008 A1    Jul. 10, 2008

(51) Int. Cl.
*H05K 7/20* (2006.01)
*H05K 7/12* (2006.01)

(52) U.S. Cl. ........................ 361/716; 361/721; 361/801; 361/803

(58) Field of Classification Search ........................ None
See application file for complete search history.

(56) References Cited

U.S. PATENT DOCUMENTS

| | | | |
|---|---|---|---|
| 4,480,287 A | 10/1984 | Jensen | |
| 4,751,963 A | 6/1988 | Bui et al. | |
| 4,819,713 A | 4/1989 | Weisman | |
| 4,825,337 A * | 4/1989 | Karpman | 361/716 |
| 4,994,937 A | 2/1991 | Morrison | |
| 5,290,122 A | 3/1994 | Hulme | |
| 5,485,353 A * | 1/1996 | Hayes et al. | 361/802 |
| 5,621,617 A * | 4/1997 | Goss et al. | 361/721 |
| 5,711,628 A * | 1/1998 | Fletcher | 403/5 |
| 5,859,764 A * | 1/1999 | Davis et al. | 361/704 |
| 6,061,239 A | 5/2000 | Blomquist | |
| 6,212,075 B1 * | 4/2001 | Habing et al. | 361/719 |
| 6,628,521 B2 * | 9/2003 | Gustine et al. | 361/704 |
| 6,665,184 B2 * | 12/2003 | Akselband | 361/699 |
| 7,349,221 B2 * | 3/2008 | Yurko | 361/719 |

* cited by examiner

*Primary Examiner*—Boris L Chervinsky
(74) *Attorney, Agent, or Firm*—Hamilton, Brook, Smith & Reynolds, P.C.

(57) ABSTRACT

A mechanical set of plates is able to simultaneously and quickly removably secure and remove one or more printed circuit boards (PCBs) in an enclosure in one single motion, and act as a heat sink to conduct heat away from the PCBs. The PCBs are removably secured through a clamping mechanism that may be a screw type or cam lever action by clamping down on the exposed card edges, thus allowing thermal transfer to begin on all cards. The apparatus may be used with any enclosure requiring thermal transfer from PCBs to the enclosure, including cages and enclosures that may or may not use forced airflow (fans or blowers) for heat dissipation.

21 Claims, 8 Drawing Sheets

MULTIPLE PRINTED CIRCUIT BOARD HEAT TRANSFER GUIDE PLATES

BACKGROUND OF THE INVENTION

As integrated circuit technology has improved, substantially greater functionality has been incorporated into devices. Along with this expanded functionality, the size of devices has diminished resulting in higher clocking frequencies and increased power consumption. As a consequence, the integrated circuit devices of today generate more heat while possessing smaller surface areas to dissipate the heat. Therefore, it is important to have a high rate of heat transfer from the integrated circuit package to maintain the temperature of the integrated circuit within safe operating limits. Excessive heat may adversely affect the performance of the circuit, cause permanent degradation of its components and increase failure rates.

A heat exchange with a heat sink may be used for transferring heat away from a heat source, such as an electronic component or printed circuit board (PCB), to maintain the component within an optimum operating temperature range, so that the component can operate continuously and with maximized efficiency. Often, the heat sink used is a special plate, called a cold plate, that contains slots for holding individual PCBs. The PCBs are held in place by a retainer, which is generally a thermally conductive metal block that is fastened along the PCB to create a point of thermal conduction with the cold plate. The retainer, along with the PCB, is placed into a slot of the cold plate.

Prior art, such as U.S. Pat. No. 4,819,713 to Weisman, provides a retainer for holding a single card in the slots of a cold plate with a rail mounted to either the module or the holder and wedge shaped bodies to be slid over the rail, attaching the rail to the cold plate, thereby providing a surface for thermal conduction. However, these devices are expensive, require an enclosure to be designed specifically to accommodate the retainer and mandate that the retainer is fixed per manufacturer instructions, which may not work for all enclosure designs. Further, if multiple cards are present, each card must be individually unfastened before removal from the enclosure, which is a time-consuming and cumbersome process that may involve numerous screws, washers and other pieces.

SUMMARY OF THE INVENTION

The present invention addresses the foregoing shortcoming or problems of the prior art. The invention apparatus is a set of mechanical plates acting as an enclosure's card guides. It may be able to clamp one or more cards in place that are in the enclosure all at the same time through the use of a solid, heavy cast or machined base guide plate and a sliding secondary plate.

An embodiment of the present invention is an apparatus and corresponding method for removably securing one or more electronic modules in a holder. A stationary guide plate and a movable guide plate form a plurality of channels to guide one or more electronic modules into position in the holder. A clamping mechanism repositions the movable guide plate such that the widths of the plurality of channels may be substantially simultaneously increased or decreased.

The adjustment of the movable guide plate may be from a minimum position (width) to a maximum, the maximum widths being 0.010 inches (0.254 mm) to 0.020 inches (0.508 mm) greater than the widths of the one or more electronic modules. The adjustment of the movable guide plate's position toward its minimum position decreases the width of the channel created by the surfaces of the movable guide plate and the stationary guide plate and may cause these surfaces to press against both sides of the one or more electronic modules inserted into the channels.

Two instances of the apparatus may be placed inside the holder; a first instance on the top inside surface of the holder and a second instance, a mirror-image of the first instance, on the bottom inside surface of the holder. Each of these instances removably secures an edge (or end) of the one or more electronic modules inserted into the channels. A clamping mechanism operates the movable guide plate of both instances of the apparatus at the same time and may be a screw or cam lever, for example. Alternatively, there may be two clamping mechanisms that independently operate the guide plates of each instance of the apparatus.

The clamping mechanism, stationary guide plates and movable guide plates may thermally conduct heat to the holder from the one or more electronic modules. The holder may be any enclosure requiring thermal transfer from one or more electronic modules to the holder. The one or more electronic modules may be PCBs. The plurality of channels may also guide the one or more electronic modules into position in the holder in alignment with a backplane connector.

Additionally, securing PCBs in such a way eliminates costly retaining hardware normally used to ensure that seated cards do not vibrate out of position or pull out during shipment or vibration testing.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

Figure 1A:
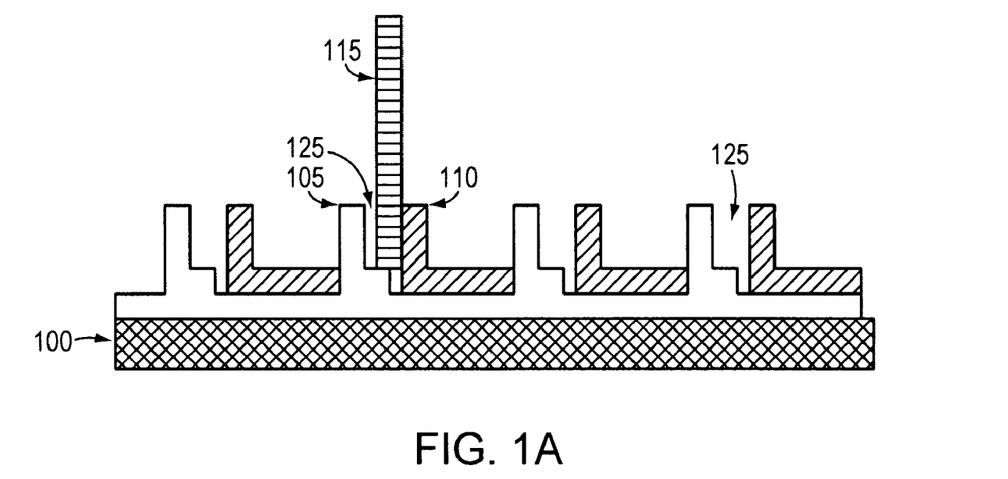
FIGS. 1A-1B are cross-sectional view illustrating the movable guide plate and stationary guide plate with four card guides, in relation to the surface of the enclosure, in an unclamped and clamped position, respectively.

FIG. 1A is a cross-sectional view illustrating the movable guide plate 105 and stationary guide plate 110 with four card guides 130, in relation to the surface of enclosure 100, in an unclamped position. It will be understood by one skilled in the art that a card guide 130 is a channel that guides each card 115 into position and in alignment to a backplane connector (not shown) that may be present that it mates to. The movable guide plate 105 makes up the left side of each card guide 130. The stationary guide plate 110 makes up the right side of each card guide 130. In this unclamped position, the width of the card guide 130 is greater than the thickness of the card 115. This nominal gap 125 allows the card 115 to slide freely into position in the card guide 130. The gap 125 may be to the left or right of the card 115, or a portion of the gap 125 may be to one side of the card 115 while the remainder of the gap 125 is to the other side of the card 115.

Figure 1B:
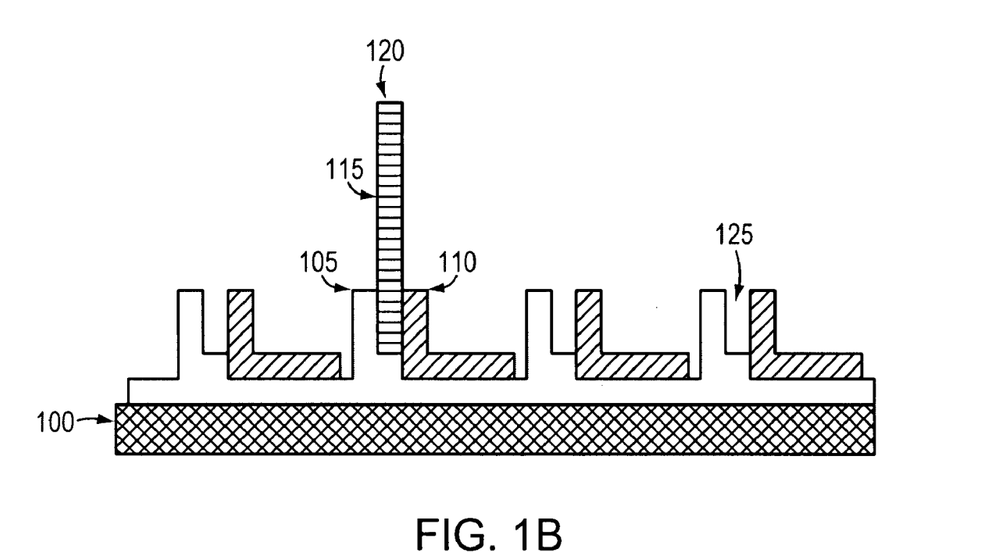

FIG. 1B is a cross-sectional view illustrating the movable guide plate 105 and stationary guide plate 110 with four card guides 130, in relation to the surface of the enclosure 100, in a clamped position. As in FIG. 1A, the movable guide plate 105 makes up the left side of each card guide 130 and the stationary guide plate 110 makes up the right side of each card guide 130. However, with the movable guide plate 105 in a clamped position there is no nominal gap 125 as in FIG. 1A. By repositioning the movable guide plate 105 to the right (toward the cooperating stationary guide plate 110), the nominal gap, previously present when the movable guide plate 105 was in an unclamped position, is removed. This repositioning causes the movable guide plate 105 to press against the left face of the card 115 and the stationary guide plate 110 to press against the right face of the PCB 115. It is by this contact between the movable guide plate 105 and stationary guide plate 110 with the card 115 that allows heat to be conducted from the card 115 to the movable guide plate 105, stationary guide plate 110, clamping mechanism (not shown) and enclosure 100.

Figure 2:
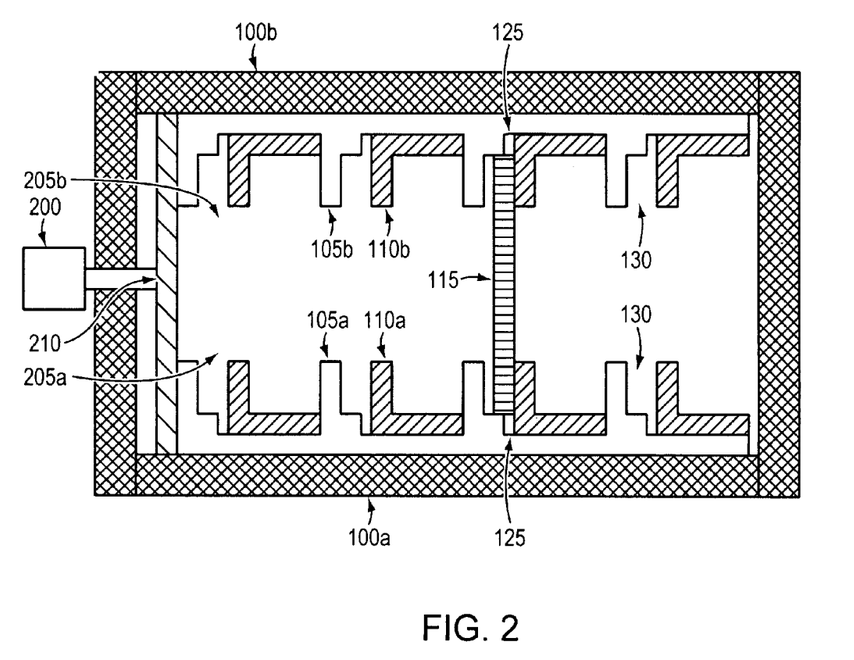
FIG. 2 is a cross-sectional view illustrating two instances of the fixed and movable guide plates in the enclosure, a card and the clamping mechanism.

FIG. 2 is a cross-sectional view illustrating two instances 205a, 205b of the movable guide plate 105a, 105b and stationary guide plate 110a, 110b in relation to two surfaces 100a, 100b of the enclosure 100, a card 115 and the clamping mechanism 200. In this example embodiment, a first instance 205a of the movable guide plate 105a and stationary guide plate 110a is placed on the bottom face 100a of the inside of the enclosure 100. A second instance 205b of the movable guide plate 105b and stationary guide plate 110b is a mirror image of the first instance 205a and is placed on the top face 100b of the inside of the enclosure 100. A card 115 may then be inserted into one of the card guides 130. The first instance 205a removably secures the bottom end or edge of the card 115 while the second instance 205b removably secures the top end or edge of the card 115. In this way, the first and second instances 205a, 205b cooperate with each other to removably secure opposite ends of cards 115, each in respective channels (card guides 130).

Once all cards 115 that are to be inserted (in this example embodiment, up to and including four cards, one per channel) into the enclosure 100 are in place and seated into their respective backplane connectors (not shown) they can be removably secured in place with a sliding action. This sliding action repositions both movable guide plates 105a, 105b simultaneously to eliminate the gaps 125 across all card guides 130. Using a single motion, the clamping mechanism 200, which may be a screw or cam lever action design, repositions the movable guide plates 105a, 105b such that the movable guide plates 105a, 105b and stationary guide plates 110a, 110b clamp down on all cards 115 at the same time. With the cards 115 removably secured in place, the cards 115 are squeezed through the contact with the movable guide plates 105a, 105b and stationary guide plates 110a, 110b such that thermal transfer may take place from the cards 115, through the movable guide plates 105a, 105b, stationary guide plates 110a, 110b and clamping mechanism 200 to the enclosure 100.

When removal of cards 115 from the enclosure 100 is required, the clamping mechanism 200 is released, also in a single motion, simultaneously removing the clamping force from all inserted cards 115. In a manner similar to, but opposite of, that described above, using a single motion, the clamping mechanism 200, which may be a screw or cam lever action design, repositions the movable guide plates 105a, 105b such that the movable guide plates 105a, 105b and stationary guide plates 110a, 110b no longer clamp down on all cards 115. This sliding action repositions both movable guide plates 105a, 105b so that gaps 125 are created. The cards 115 may now be freely unseated from their respective backplane connectors (not shown) and removed from the enclosure 100.

Figures 3A, 3B:
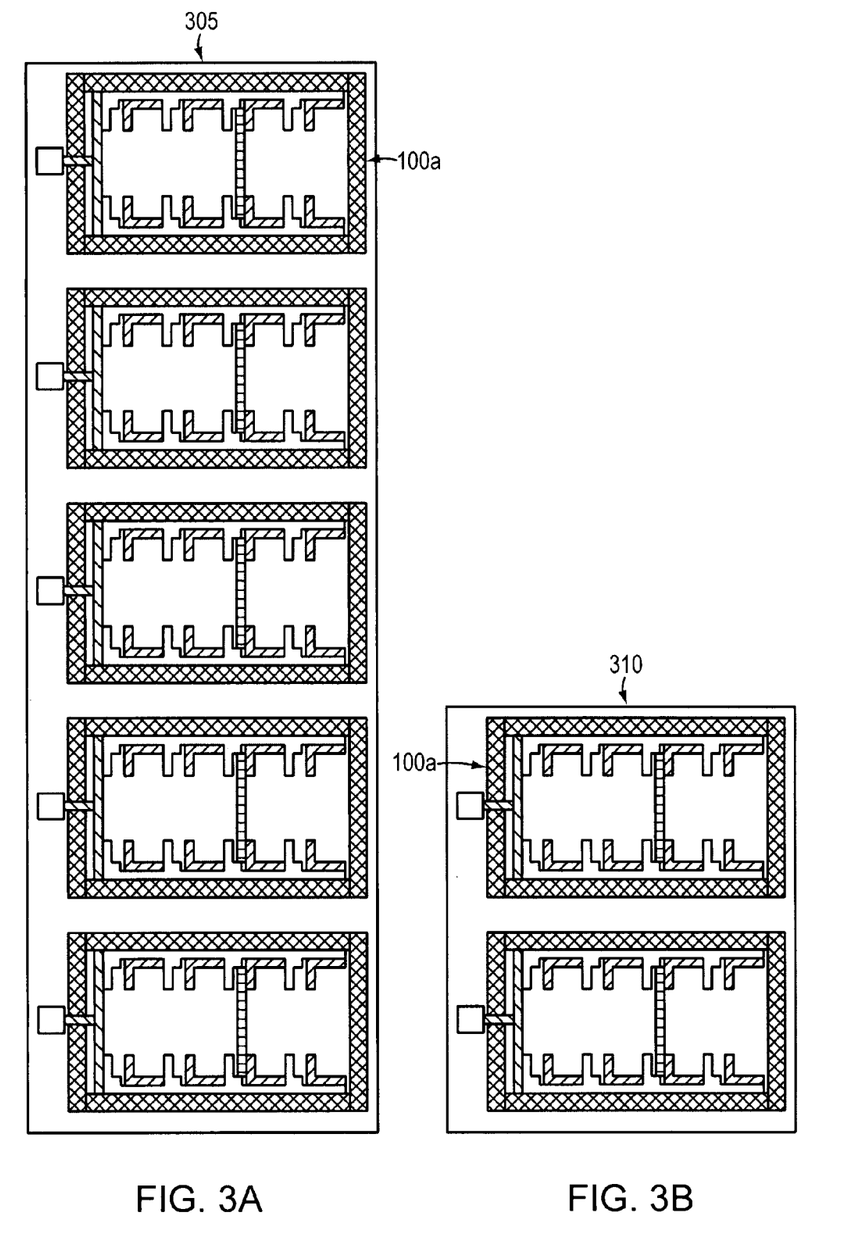
FIGS. 3A and 3B are diagrams illustrating multiple enclosures mounted in a rack and ruggedized case, respectively.

FIGS. 3A and 3B are diagrams illustrating multiple enclosures 100 mounted in a rack 305 and a ruggedized case 310, respectively.

Figure 4A:
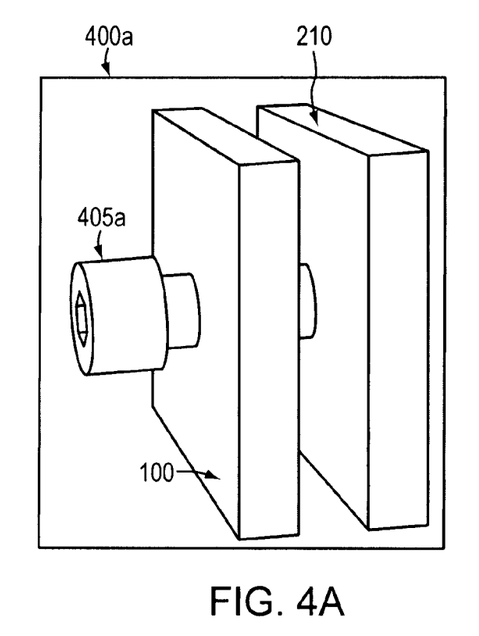
FIG. 4A is a perspective view illustrating an example embodiment of the clamping mechanism using a screw.

FIG. 4A is a perspective view illustrating an example embodiment 400a of the clamping mechanism 200 using a screw. In this example embodiment 400a, a screw 405a is threaded through the enclosure 100. The distal end of the screw 405a is attached to the connector 210 portion of the clamping mechanism which connects to the two movable guide plates (not shown). The screw 405a is attached to the connector 210 in such a way that the attached end is able to rotate freely as the screw 405a is threaded through the enclosure 100. The threading action and unthreading action of the screw 405a through the enclosure 100 causes the connector 210 to be moved in either direction along the axis of the screw 405a so that the connected movable guide plates 105a, 105b (shown in FIG. 2) are repositioned. As described above with reference to FIG. 2, repositioning of the guide plates 105a, 105b such that they clamp down on the cards 115 removably secures them in place and allows thermal conduction.

Figure 4B:
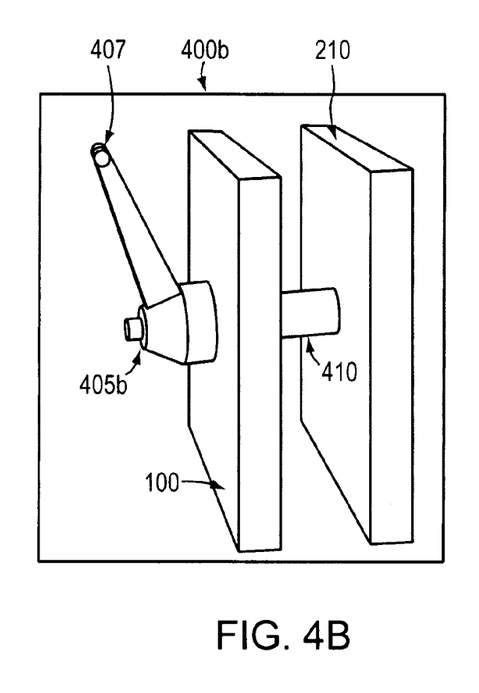
FIG. 4B is a perspective view illustrating an example embodiment of the clamping mechanism using a cam lever.

FIG. 4B is a perspective view illustrating an example embodiment 400b of the clamping mechanism 200 using a cam lever. In this example embodiment 400b, a cam lever 405b is attached to the enclosure 100. The end of the piston 410 of the cam lever 405b is attached to the connector 210 portion of the clamping mechanism that connects to the two movable guide plates (shown in FIG. 2). The cam lever 405b is attached to the enclosure 100 and connector 210 in such a way that raising and lowering the handle 407 causes the piston 410 to be extended and retracted, thereby causing the connector 210 to be moved in either direction along the axis of the piston 410 so that the connected movable guide plates 105a, 105b (not shown) are repositioned. As described above with reference to FIG. 2, repositioning of the guide plates 105a, 105b such that they clamp down on the cards 115 removably secures them in place and allows thermal conduction.

Figure 5A:
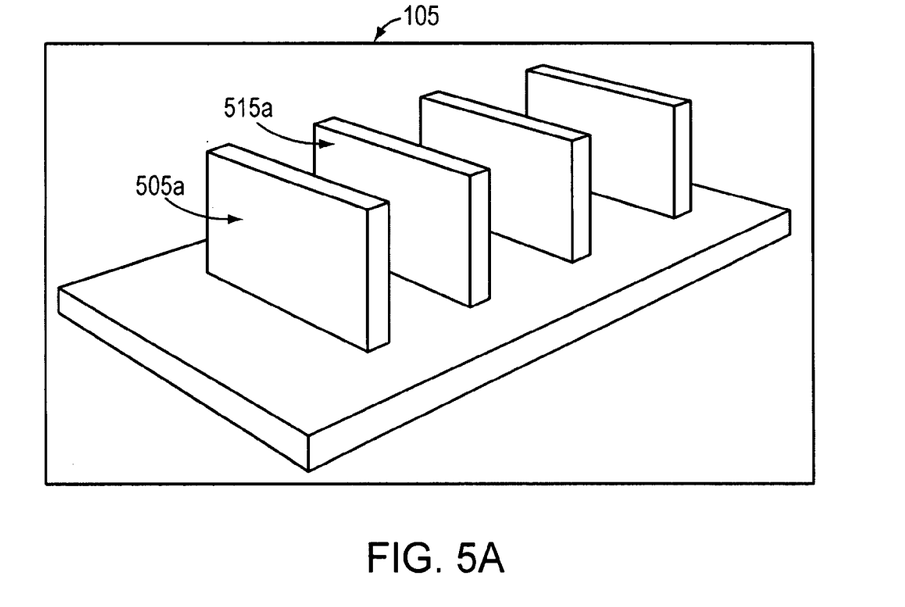
FIGS. 5A-5C are perspective views illustrating an example embodiment of a movable guide plate alone, a stationary guide plate alone and a movable and a stationary guide plate together, respectively.
Figure 5B:
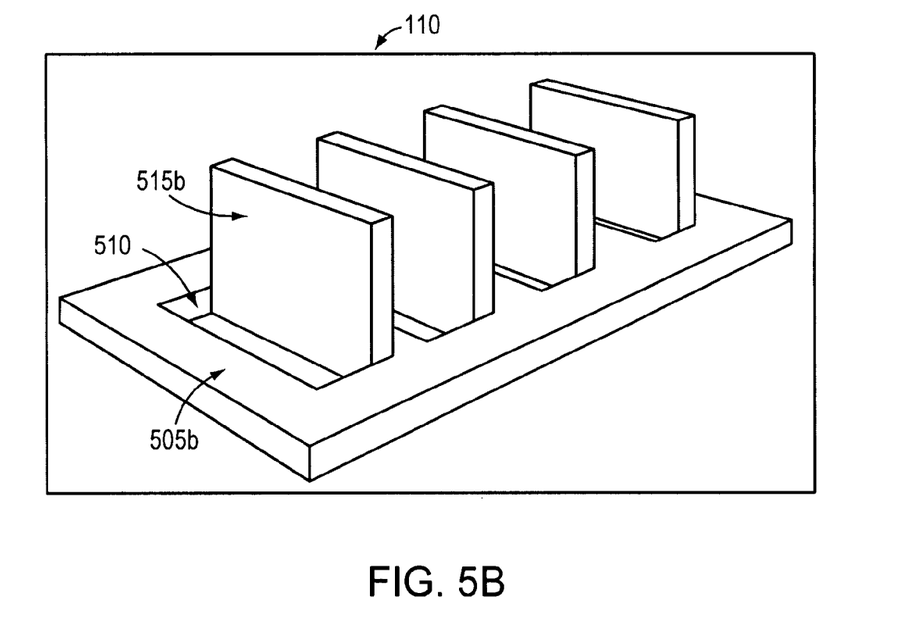
Figure 5C:
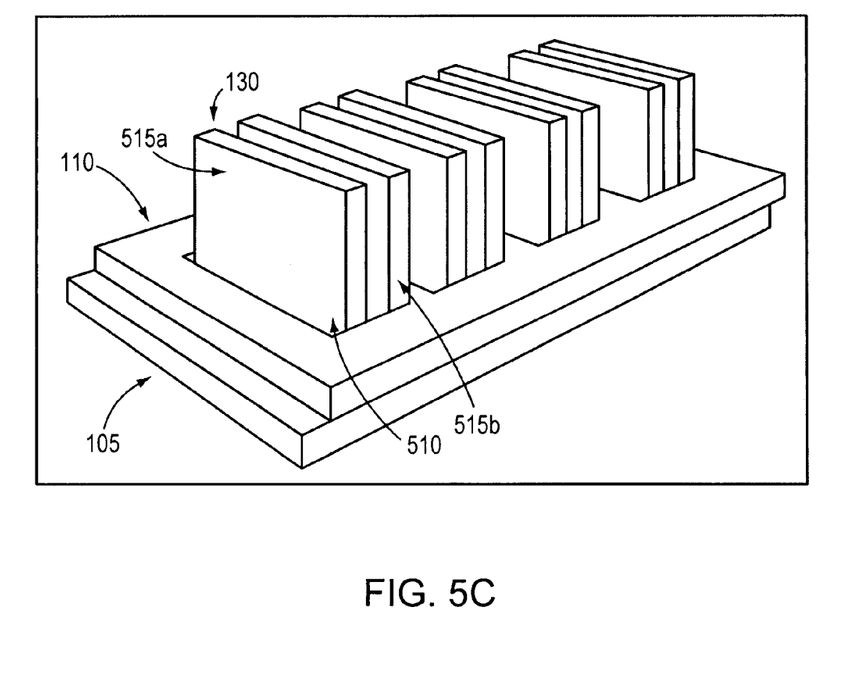

FIGS. 5A-5C are perspective views illustrating an example embodiment of a movable guide plate 105 alone, a stationary guide plate 110 alone and a movable 105 and a stationary 110 guide plate together, respectively.

FIG. 5A is a perspective view illustrating an example embodiment of a movable guide plate 105 having a base 505a and four risers 515a. The risers 515a are the portion of the movable guide plate 105 that comes in contact with the cards 115 to removably secure them in place and allow thermal conduction.

FIG. 5B is a perspective view illustrating an example embodiment of a stationary guide plate 110 having a base 505b, four risers 515b and four openings 510, one for each riser 515b. The risers 515b are the portion of the stationary guide plate 110 that come in contact with the cards 115 to removably secure them in place and allow thermal conduction. The openings 510 allow the risers 515a of the movable guide plate 105 to pass through the base 505b of the stationary guide plate 10 to align with the risers 515b of the stationary guide plate 110 to create the card guides 130 in FIG. 2.

FIG. 5C is a perspective view illustrating an example embodiment formed of the movable guide plate 105 of FIG. 5A and the stationary guide plate 110 of FIG. 5B. The stationary guide plate 110 is positioned on top of the movable guide plate 105 so that, through the underside of the base 505b of the stationary guide plate 110, the four risers 515a of the movable guide plate 105 are aligned with and pass through the four openings 510 in the stationary guide plate 110. This results in the four risers 515a of the movable guide plate 105 being paired with and aligned with the four risers 515b of the stationary guide plate 110. The associated riser pairs 515a, 515b make each card guide 130, illustrated in FIG. 1A. The guide plates 105, 110 may then be operated as described above with reference to FIG. 2.

Figure 6A:
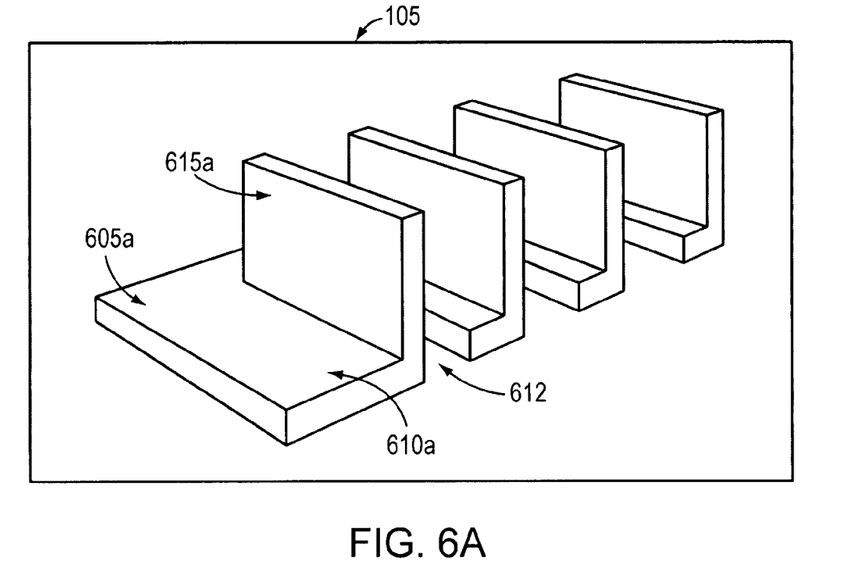
FIGS. 6A-6C are perspective views illustrating another example embodiment of a movable guide plate alone, a stationary guide plate alone and a movable and a stationary guide plate together, respectively.
Figure 6B:
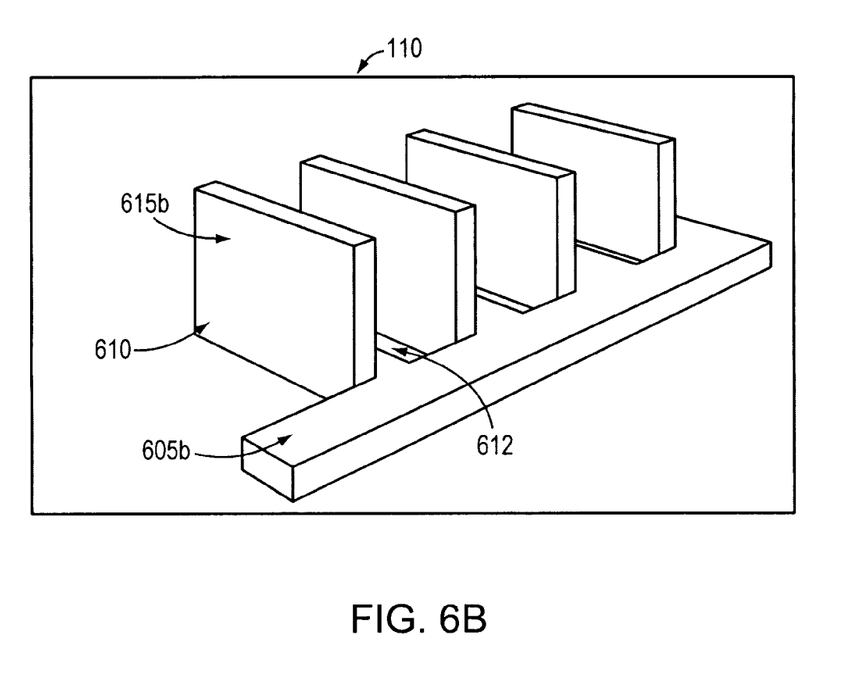
Figure 6C:
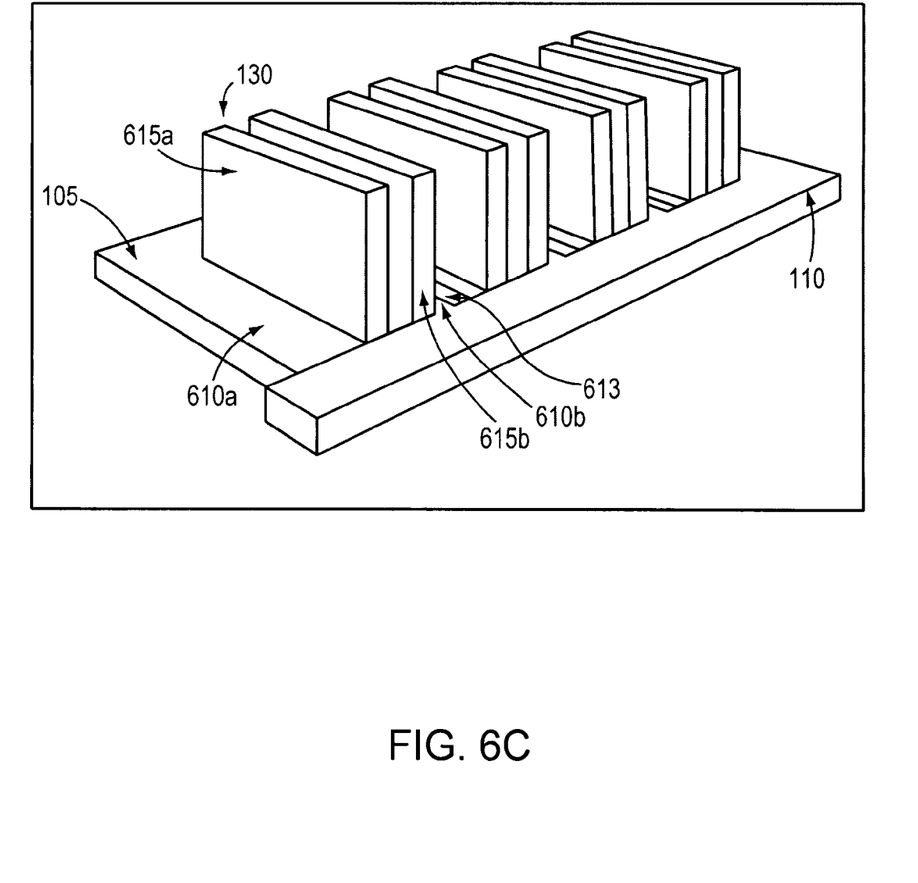

FIGS. 6A-6C are perspective views illustrating an example embodiment of a movable guide plate 105 alone, a stationary guide plate 110 alone and a movable 105 and a stationary 110 guide plate together, respectively.

FIG. 6A is a perspective view illustrating an example embodiment of a movable guide plate 105 having a base 605a, four fingers 610a and four risers 615a. The risers 615a are the portion of the movable guide plate 105 that comes in contact with the cards 115 to removably secure them in place and allow thermal conduction. The four fingers 610a are evenly spaced 612 and allow the movable guide plate 105 and stationary guide plate 110 to be fit together to create card guides 130 with the risers 615a, 615b.

FIG. 6B is a perspective view illustrating an example embodiment formed of a stationary guide plate 110 having a base 605b, four fingers 610b and four risers 615b. The risers 615b are the portion of the stationary guide plate 110 that comes in contact with the cards 115 to removably secure them in place and allow thermal conduction. The four fingers 610b are evenly spaced 612, the spacing being equal to that of the fingers 610a of the movable guide plate 105, and allow the movable guide plate 105 and stationary guide plate 110 to be fit together to create card guides 130 with the risers 615a, 615b. Further, the stationary guide plate 110 is a duplicate of the movable guide plate 105 of FIG. 6A except that it is rotated 180 degrees on the horizontal plane. This provides certain manufacturing and assembly advantages.

FIG. 6C is a perspective view illustrating an example embodiment of the movable guide plate 105 of FIG. 6A and the stationary guide plate 110 of FIG. 6B. The movable guide plate 105 and stationary guide plate 110 are positioned in such a way that their respective fingers 610a, 610b are juxtaposed and interlocked. The width of the fingers 610a, 610b is less than the even spacing 612 between the fingers such that gaps 613 remain between the associated pairs of fingers 610a, 610b so that the movable guide plate's fingers 610a can be repositioned. The associated riser pairs 615a, 615b make each card guide 130 as illustrated in FIG. 1A. The guide plates 105, 110 may then be operated as described above with reference to FIG. 2.

While this invention has been particularly shown and described with references to example be made therein without departing from the scope of the embodiments thereof, it will be understood by those skilled in the art that various changes in form and details may invention encompassed by the appended claims.

What is claimed is:

1. An apparatus for securing at least one electronic module in a holder, the apparatus comprising:
    a stationary guide plate including a plurality of stationary boundaries;
    a movable guide plate including a plurality of movable boundaries, each movable boundary being positioned opposite a respective stationary boundary of the stationary guide plate, a plurality of channels being formed by a respective stationary and a movable boundary, the channels serving to guide at least one electronic module into position in the holder; and
    a clamping mechanism configured to enable repositioning of the movable guide plate in a manner where the widths of the plurality of channels substantially simultaneously increase or decrease for removably securing an electronic module in a holder.

2. An apparatus according to claim 1 wherein the clamping mechanism is configured to enable repositioning of the movable guide plate to a position between a maximum channel width position and a minimum channel width position.

3. An apparatus according to claim 2 wherein the clamping mechanism is configured to enable positioning of the movable guide plate to a position where the plurality of stationary boundaries and the plurality of movable boundaries are pressed substantially simultaneously against a first surface and a second surface of the at least one electronic module, respectively.

4. An apparatus according to claim 3 wherein a first instance of the apparatus is placed on a bottom face of an inside of the holder and a second instance of the apparatus, in a mirror fashion to that of the first instance, is placed on a top face of the inside of the holder to removably secure bottom edges and top edges of the at least one electronic module, respectively.

5. An apparatus according to claim 4 wherein the clamping mechanism substantially simultaneously operates, in one action, both the movable plate on the first instance and the movable plate on the second instance.

6. An apparatus according to claim 5 wherein the at least one electronic module is a printed circuit board.

7. An apparatus according to claim 5 wherein the clamping mechanism, stationary guide plates and movable guide plates include materials to thermally conduct heat to the holder through contact with the at least one electronic module.

8. An apparatus according to claim 5 wherein the clamping mechanism includes a screw or cam lever.

9. An apparatus according to claim 5 wherein the holder is an enclosure formed of a material in which thermal transfer from the at least one electronic module to the holder is desired.

10. An apparatus according to claim 9 wherein the plurality of channels are arranged to guide the at least one electronic module into position in alignment with a backplane connector.

11. A method for securing at least one electronic module in a holder, the method comprising:
    using a stationary guide plate providing a plurality of stationary boundaries;
    using a movable guide plate providing a plurality of movable boundaries, each movable boundary being opposite a respective stationary boundary of the stationary guide plate; and
    forming channels between respective pairs of movable boundaries and stationary boundaries, the channels enabling at least one electronic module to be guided into position in the holder, and widths of the channels being substantially simultaneously increasable or decreasable by positioning the movable boundaries.

12. A method according to claim 11 further comprising enabling positioning of the movable guide plate to a position between a maximum channel width position and a minimum channel width position.

13. A method according to claim 12 further comprising enabling positioning of the movable guide plate such that the plurality of stationary boundaries and the plurality of movable boundaries are pressed substantially simultaneously against a first surface and a second surface of the at least one electronic module, respectively.

14. A method according to claim 13 further comprising forming a first instance of the stationary guide plate providing a plurality of stationary first boundaries and the movable guide plate providing a plurality of movable boundaries, each movable boundary being opposite its respective stationary boundary of the stationary guide plate, on a bottom face of the inside of a holder, and forming a second instance of the stationary guide plate providing a plurality of stationary boundaries and the movable guide plate providing a plurality of movable boundaries, in a mirror fashion to that of the first instance, on a top face of the inside of the holder, to removably secure bottom edges and top edges of the at least one electronic module, respectively.

15. A method according to claim 14 further comprising enabling substantially simultaneous positioning, in one action, of both the movable plate on the first instance and the movable plate on the second instance.

16. A method according to claim 15 wherein the at least one electronic module is a printed circuit board.

17. A method according to claim 15 wherein a clamping mechanism, stationary guide plates and movable guide plates include materials to thermally conduct heat to the holder through contact with the electronic at least one electronic module.

18. A method according to claim 15 wherein the clamping mechanism includes a screw or cam lever.

19. A method according to claim 15 wherein the holder is an enclosure formed of a material in which thermal transfer from the at least one electronic module to the holder is desired.

20. A method according to claim 19 further comprising guiding the at least one electronic module into position in plurality of channels in alignment with a backplane connector.

21. A system for securing at least one electronic module in a holder, the system comprising:
- stationary guide plate means for providing a plurality of stationary boundaries;
- movable guide plate means for providing a plurality of movable boundaries, each movable boundary being opposite its respective stationary boundary of the stationary guide plate;
- means for guiding the at least one electronic module into position in the holder in a plurality of channels formed by the pairs of stationary and movable boundary pairs; and
- means for positioning the movable boundaries in a manner where widths of the plurality of channels are substantially simultaneously increased or decreased.

* * * * *